United States Patent
Han et al.

(10) Patent No.: US 9,490,047 B2
(45) Date of Patent: Nov. 8, 2016

(54) DIELECTRIC FLUID WITH FARNESENE-BASED OLIGOMER

(71) Applicant: Dow Global Technologies LLC, Midland, MI (US)

(72) Inventors: Suh Joon Han, Belle Mead, NJ (US); Brian R. Maurer, North Wales, PA (US); Xiaodong Zhang, Belle Mead, NJ (US)

(73) Assignee: Dow Global Technologies LLC, Midland, MI (US)

( * ) Notice: Subject to any disclaimer, the term of this patent is extended or adjusted under 35 U.S.C. 154(b) by 195 days.

(21) Appl. No.: 14/366,237

(22) PCT Filed: Dec. 5, 2012

(86) PCT No.: PCT/US2012/067894
§ 371 (c)(1),
(2) Date: Jun. 17, 2014

(87) PCT Pub. No.: WO2013/101414
PCT Pub. Date: Jul. 4, 2013

(65) Prior Publication Data
US 2014/0313670 A1 Oct. 23, 2014

Related U.S. Application Data

(60) Provisional application No. 61/581,848, filed on Dec. 30, 2011.

(51) Int. Cl.
*H01B 3/20* (2006.01)
*H01B 3/22* (2006.01)
*H05K 7/20* (2006.01)

(52) U.S. Cl.
CPC *H01B 3/20* (2013.01); *H01B 3/22* (2013.01); *H05K 7/20218* (2013.01)

(58) Field of Classification Search
CPC .......... H01B 3/20; H01B 3/22; H01B 3/307
USPC ....................................... 252/570
See application file for complete search history.

(56) References Cited

U.S. PATENT DOCUMENTS

| | | | |
|---|---|---|---|
| 2,105,407 A | 1/1938 | Clark | |
| 3,843,742 A | 10/1974 | Yagi et al. | |
| 5,766,517 A * | 6/1998 | Goedde | H01F 27/12 252/570 |
| 6,340,658 B1 | 1/2002 | Cannon et al. | |
| 6,398,986 B1 * | 6/2002 | McShane | C09K 5/10 174/17 LF |
| 6,726,857 B2 | 4/2004 | Goedde et al. | |
| 6,790,386 B2 * | 9/2004 | Fefer | H01B 3/22 208/14 |
| 7,399,323 B2 | 7/2008 | Renninger et al. | |
| 7,476,344 B2 | 1/2009 | Sunkara et al. | |
| 7,659,097 B2 | 2/2010 | Renninger et al. | |
| 7,691,792 B1 * | 4/2010 | Fisher | C07C 13/18 508/110 |
| 8,268,199 B1 * | 9/2012 | Forest | C10M 105/42 252/570 |
| 8,580,160 B2 * | 11/2013 | Han | C08L 91/00 252/570 |
| 8,586,814 B2 * | 11/2013 | Fisher | C07C 2/04 106/130.1 |
| 8,669,403 B2 * | 3/2014 | Fisher | C07C 13/18 252/73 |
| 8,753,549 B2 * | 6/2014 | Han | H01B 3/20 252/570 |
| 8,801,975 B2 * | 8/2014 | Rapp | H01B 3/20 174/17 LF |
| 9,012,385 B2 * | 4/2015 | Di Biase | C08F 220/68 508/463 |
| 2009/0035842 A1 | 2/2009 | Trimbur et al. | |
| 2009/0053342 A1 | 2/2009 | Streekstra et al. | |
| 2009/0140830 A1 | 6/2009 | Amanullah et al. | |
| 2010/0038583 A1 | 2/2010 | Shimomura et al. | |
| 2011/0282113 A1 | 11/2011 | Fisher et al. | |
| 2012/0209040 A1 * | 8/2012 | Wright | C07C 2/28 585/16 |
| 2014/0110143 A1 | 4/2014 | Han et al. | |
| 2014/0221258 A1 * | 8/2014 | Ohler | C07C 5/05 508/110 |

FOREIGN PATENT DOCUMENTS

| | | |
|---|---|---|
| EP | 1995301 A1 | 11/2008 |
| WO | 00/26925 A1 | 5/2000 |
| WO | 2010/027464 A1 | 3/2010 |

\* cited by examiner

*Primary Examiner* — Ellen McAvoy
(74) *Attorney, Agent, or Firm* — Husch Blackwell LLP

(57) ABSTRACT

The present disclosure is directed to a dielectric fluid comprising a farnesene-based oligomer and an antioxidant and devices containing the dielectric fluid.

20 Claims, No Drawings

DIELECTRIC FLUID WITH FARNESENE-BASED OLIGOMER

FIELD

The present disclosure is directed to a dielectric fluid containing a farnesene-based oligomer and devices containing the dielectric fluid.

BACKGROUND

Dielectrics are non-conducting fluids used in a variety of applications. The insulative and cooling properties of dielectric fluids find use in electrical components such as transformers, capacitors, switching gears, transmission components, distribution components, switches, regulators, circuit breakers, autoreclosers, fluid-filled transmission lines, and other electrical apparatuses.

In a transformer, the dielectric fluid provides coolant and insulative properties to the internal transformer components. The dielectric fluid cools the transformer and also provides part of the electrical insulation between internal live parts. Requirements for dielectric fluid include a long operating life (10-20 years) and stability at high temperatures (above ambient) for an extended period.

Polychlorinated biphenyl compounds (also known as "PCB's"), once used as dielectric fluid in transformers, have been phased out due to their toxic properties and negative environmental impact. Non-toxic transformer oils that have replaced PCB's include silicone-based or fluorinated hydrocarbon oils, mineral oils, fatty acid esters, vegetable-based oils and seed oils. These non-toxic oils have drawbacks regarding viscosity, flash point, fire point, pour point, water saturation point, dielectric strength and/or other properties limiting their usefulness as dielectric fluids.

Consequently, a need exists for a non-toxic, biodegradable, PCB-free dielectric fluid for electrical components that have the same, or substantially the same, chemical, mechanical, and/or physical properties as PCB-based dielectric fluid.

SUMMARY

The present disclosure provides a dielectric fluid. In an embodiment, the dielectric fluid comprises a farnesene-based oligomer and an antioxidant. The farnesane-based oligomer has a molecular weight from 600 g/mol to 2500 g/mol.

The present disclosure provides a device. In an embodiment, the device comprises an electrical component and a dielectric fluid. The dielectric fluid is in operative communication with the electrical component. The dielectric fluid comprises a farnesene-based oligomer and an antioxidant. The farnesene-based oligomer has a molecular weight from 600 g/mol to 2500 g/mol.

DETAILED DESCRIPTION

A dielectric fluid performs at least two functions. First, a dielectric fluid serves as electrical insulation in an electrical component. The dielectric fluid should be capable of withstanding the voltages present in an electrical component such as a transformer, for example. Second, a dielectric fluid functions as a heat transfer medium to dissipate heat generated within the electrical component. The dielectric fluid may also reduce the corrosive effects of oxygen and moisture. Thus, a dielectric fluid requires insulative properties while simultaneously being resistant to thermal oxidation and degradation.

The present disclosure provides a dielectric fluid. In an embodiment, the dielectric fluid includes a farnesene-based oligomer having a molecular weight from 600 g/mol to 2500 g/mol. The dielectric fluid also includes an antioxidant.

The term "farnesene-based oligomer" is a farnesene oligomer with at least 3 farnesene molecules bonded to each other (i.e., at least 3 polymerized units derived from farnesene), or farnesene oligomer with 4, or 5, or 6 to 10 units derived from farnesene; a farnesene/terpenoid oligomer; mixtures thereof; and hydrogenated derivatives thereof. The farnesene-based oligomer has a molecular weight from 600 g/mol to 2500 g/mol.

A "farnesene," as used herein, collectively refers to α-farnesene, β-farnesene and the respective stereoisomers of each. α-Farnesene has the structure (I) and β-farnesene has the structure (II) as set forth below.

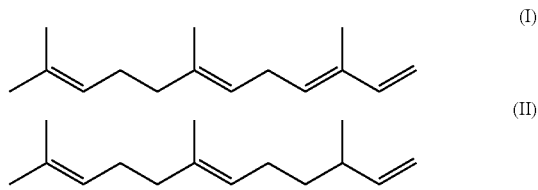

1. Genetically-Modified Farnesene

In an embodiment, the farnesene is a genetically-modified farnesene. A "genetically-modified farnesene," or "GMF," as used herein, is a farnesene produced from genetically-modified host cells that include an enzymatic pathway for making isopentenyl pyrophosphate ("IPP"). The pathway enzymes are under control of one or more heterologous transcriptional regulators. The host cells convert a carbon source into the farnesene. The host cells are cultured in a medium under conditions that can be adjusted to obtain a desired growth rate for the host cells.

The enzymatic pathway is the mevalonate pathway or the deoxyxylulose 5-phosphate pathway. The "mevalonate pathway" (or MEV pathway) is the biosynthetic pathway that converts acetyl-CoA to isopentyl pyrophosphate (or IPP). The "deoxyxylulose 5-phosphate pathway" (or DXP pathway) is the biosynthetic pathway that converts glyceraldehyde-3-phosphate and pyruvate to IPP and dimethylallyl pyrophosphate ("DMAPP"). The engineered MEV pathway and/or DXP pathway yield high-level production of isoprenoids (i.e., isoprenoid levels greater than found naturally) in a host cell. The pathway is typically engineered via recombinant DNA technology by expressing heterologous sequences encoding enzymes in at least one of these pathways.

The "host cell" is a genetically modified host microorganism in which nucleic acid molecules have been inserted, deleted or modified (i.e., mutated, by insertion, deletion, substitution, and/or inversion of nucleotides), to either produce a desired isoprenoid compound or isoprenoid derivative. Nonlimiting examples of suitable host cells include any archae, prokaryotic, or eukaryotic cell.

In an embodiment, the host cell is selected from *Escherichia coli*, *Enterococcus*, *Pseudomona*, and *Staphyloccoccus*.

The host cells are cultured in a fermentation medium which includes a carbon source such as carbohydrates such as monosaccharides, oligosaccharides and polysaccharides;

organic acids such as acetic acid, propionic acid; and alcohols such as ethanol propanol, and polyols such as glycerol.

In an embodiment, the GMF is derived from farnesyl pyrophosphate (FPP). FPP is made by the condensation of two molecules of IPP with one molecule of DMAPP. An enzyme known to catalyze this step is farnesyl pyrophosphate synthase. Alternatively, FPP can be made by adding IPP to geranyl pyrophosphate. The FPP is subsequently converted to a $C_{15}$ compound. Nonlimiting examples of $C_{15}$ compounds that can be made by the FPP include amorphadiene, α-farnesene, β-farnesene, farnesol, nerolidol, patchoulol, and valencene.

In an embodiment, the FPP is converted to farnesene.

In an embodiment, the farnesene oligomer is a farnesene trimer. Farnesene can be trimerized using a catalyst system obtained by reducing a nickel compound with an organic metal compound in the presence of various kinds of ligands such as acetylene compound, organic arsenic compound, organic antimony compound, phosphorus compound, isonitrile compound, and isocyanate compound. Other examples of catalysts suitable for oligomerizing farnesene include Ziegler-Natta catalyst, Kaminsky catalyst, metallocene catalyst, organolithium reagent, and combinations thereof.

In an embodiment, GMF is oligomerized to produce farnesene trimer.

In an embodiment, the farnesene-based composition is a farnesene/terpenoid oligomer. Oligomerization of farnesene and terpenoid may occur by utilizing one or more of the catalyst systems for farnesene oligomerization as disclosed above. The farnesene/terpenoid oligomer contains one or more units derived from farnesene bonded to one or more units derived from a terpenoid.

A "terpenoid" (or isoprenoid), as used herein, is a chemically modified terpene wherein one or more methyl groups is/are moved or removed. The term "terpenoid" also includes a terpene with one or more added oxygen atom(s). A "terpene," as used herein, is a hydrocarbon based on an isoprene unit, $(C_5H_8)_n$, where "n" is the number of linked isoprene units and "n" is an integer from 1, or 2 to 8 or more. Isoprene, $C_5H_8$, has the structure (III) below.

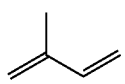
(III)

Nonlimiting examples of terpenes include hemiterpene (1 isoprene unit), monoterpene (2 isoprene units), sesquiterpene (three isoprene units), diterpene (4 isoprene units), triterpene (6 isoprene units), tetraterpene (8 isoprene units), and polyterpene (more than 8 isoprene units). Terpenes can be extracted from natural sources such as plants, microbes and animals. Terpenes can also be produced synthetically.

In an embodiment, the farnesene/terpenoid oligomer has the structure (IV):

$$-[F]m-[T]n- \quad (IV)$$

wherein F represents units derived from farnesene, T represents units derived from terpenoid, each of m and n is an integer from 1 to 9, and wherein 3≤m+n≤10.

In an embodiment the terpenoid is selected from zingiberene, bisabolene, farnesene epoxide, farnesol, squalene, ergosol, and combinations thereof. The individual F units and the individual T units in the farnesene/terpenoid oligomer may be randomly arranged or in a block arrangement in the oligomer backbone.

Zingiberene has the structure (V).

Bisabolene has the structure (VI).

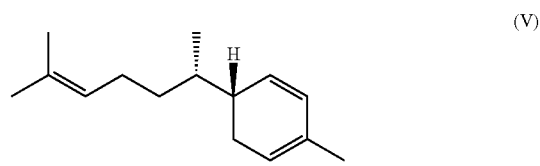

Farnesene epoxide has the structure (VII).

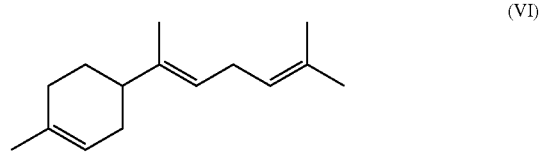

Farnesol has the structure (VIII).

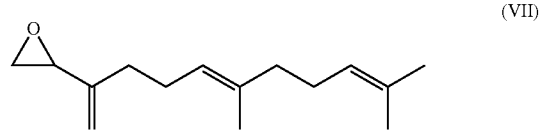 [SMILES: C=C(CC/C=C(\C)CCC=C(C)C)C1CO1]

Squalene has the structure (IX).

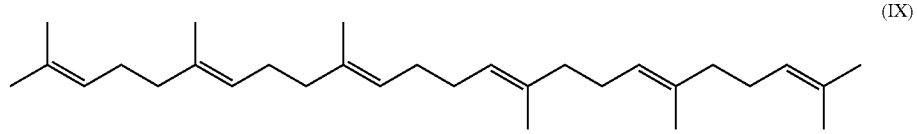 [SMILES: CC(C)=CCC/C(C)=C/CC/C(C)=C/CC/C=C(\C)CC/C=C(\C)CCC=C(C)C]

Ergosol has the structure (X).

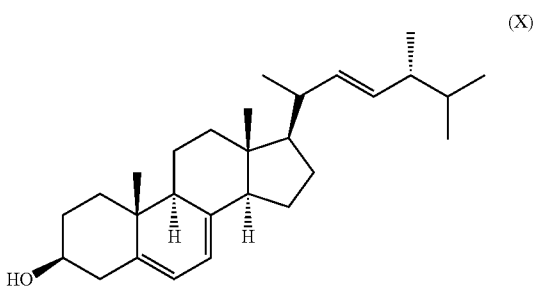

(X)

In an embodiment, the terpenoid may be a genetically-modified terpenoid produced by way of the genetically engineered enzymatic pathway for making IPP as disclosed above.

In an embodiment, the farnesene/terpenoid oligomer includes units derived from a GMF and units derived from a genetically-modified terpenoid.

In an embodiment, the farnesene/terpenoid oligomer includes from 70 wt % to 99 wt % units derived from farnesene and from 30 wt % to 1 wt % units derived from terpenoid. Weight percent is based on total weight of the farnesene/terpenoid oligomer.

During oligomerization, the molecular weight is controlled so that the farnesene-based oligomer has a molecular weight from 600 g/mol, or 800 g/mol to 1000 g/mol, or 2000 g/mol, or 2500 g/mol. Hydrogenolysis, $H_2$ addition, chain transfer for β-H elimination reaction, alone or in combination, are nonlimiting examples of reactions that may be utilized to control the molecular weight of the farnesene-based oligomer.

Applicant discovered that farnesene-based oligomer with a molecular weight from 600 g/mol to 2500 g/mol advantageously exhibits a balance of properties suitable for dielectric fluid, namely, (i) a viscosity less than 50 cSt at 40° C., (ii) a fire point temperature greater than 300° C., and (iii) a pour point less than −20° C.

In an embodiment, the farnesene-based oligomer includes the following hydrogenated derivatives: farnesane oligomer and farnesane/terpenoid oligomer. Any reducing agent that can reduce a C≡C bond to a C≡C bond can be used to hydrogenate the farnesene-based composition. For example, the farnesene-based oligomer may be hydrogenated by reducing farnesene to farnesane in the presence of hydrogen with a catalyst such as Pd, Pd/C, Pt, $PtO_2$, Ru(triphenylphosphine)$_2C_{12}$, Raney nickel, or combinations thereof. The terpenoid can be hydrogenated in a similar manner.

The compound "farnesane" has the structure (XI) below.

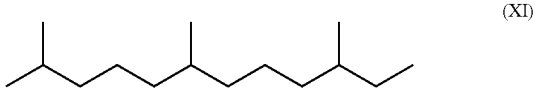

(XI)

In an embodiment, the dielectric fluid contains from 1.0 wt % to 99 wt % farnesene-based oligomer.

The present farnesane-based oligomer may comprise two or more embodiments discussed herein.

2. Antioxidant

The present dielectric fluid contains an antioxidant. The antioxidant provides oxidative stability for the dielectric fluid. The antioxidant can be a phenolic antioxidant or an amine antioxidant. Nonlimiting examples of suitable antioxidant include 2,2'-methylenebis(4-methyl-6-tert-butylphenol), tetrakis[methylene(3,5-di-t-butyl-4-hydroxyhydrocinnamate)]methane; N,N' dioctyldiphenylamine, di-β-naphtyl-para-phenylenediamine, reaction products of n-phenylbenzenamine and 2,4,4-trimethlypentane (IRGANOX™ 1-57), nonylated diphenylamine (Naugalube™ 438L), and any combination of the foregoing.

In an embodiment, the antioxidant is tetrakis[methylene (3,5-di-t-butyl-4-hydroxyhydrocinnamate)]methane.

In an embodiment, the present dielectric fluid contains from 0.1 wt % to 1.0 wt %, or 1.5 wt %, or 2.0 wt % antioxidant. Weight percent is based on total weight of the dielectric fluid.

3. Additives

The present dielectric fluid may optionally include one or more of the following additives: an oxidation inhibitor, a corrosion inhibitor, a metal deactivator, a pour point depressant, and any combination thereof.

In an embodiment, the dielectric fluid includes a metal deactivator. The metal deactivator improves the oxidative stability of the dielectric fluid. Nonlimiting examples of suitable metal deactivators include copper deactivator and aluminum deactivator. Copper has a catalytic effect in the oxidation of oil. The antioxidants react with free oxygen thereby preventing the latter from attacking the oil. A copper deactivator such as benzotriazole derivatives reduces the catalytic activity of copper in the dielectric fluid. In an embodiment, the dielectric fluid contains less than 1 wt % of a copper deactivator. IRGAMET-30™ is a commercially available metal deactivator from Ciba Specialty Chemicals and is a triazole derivative, N,N-bis(2-Ethylhexyl)-1H-1,2, 4-triazole-1 methanamine.

In an embodiment, the present dielectric fluid includes 0.1 wt % to less than 0.7%, or less than 1.0 wt % metal deactivator (based on the total weight of the dielectric fluid).

In an embodiment, the dielectric fluid includes a pour point depressant. Nonlimiting examples of suitable pour point depressants include methacrylic acid ester, polyalkyl methacrylate, fatty acid alkyl esters from fatty acids, polyvinyl acetate oligomers, acrylic oligomers, VISCOPLEX™ 10-310, VISCOPLEX™ 10-930, and VISCOPLEX™ 10-950 (product under the tradename VISCOPLEX™ is available from Rohmax, Inc.). In an embodiment, the pour point depressant is a polymethacrylate (PMA).

In an embodiment, the dielectric fluid includes from 98 wt % to 99 wt % farnesene-based composition, from 1 wt % to 2 wt % antioxidant, and from 0 wt %, or greater than 0 wt % to 1 wt % additive. Weight percent is based on the total weight of the dielectric fluid.

In an embodiment, the dielectric fluid may further include a blend component. The blend component may be one or more of the following: a microbial oil, a vegetable oil, a seed oil, a mineral oil, a silicone fluid, a synthetic ester, a poly alpha olefin, polysiloxane, pentaerythritol ester, poly (butene) liquid, and combinations thereof.

A microbial oil is an oil produced by a microorganism. Examples of microorganisms include algae, bacteria, yeast, and/or fungi. In an embodiment the microbial oil is an oil produced by a genetically-engineered microorganism.

Nonlimiting examples of suitable vegetable oils include coconut oil, palm oil, wheat germ oil, soya oil, olive oil, corn oil, sunflower oil, safflower oil, hemp oil, and rapeseed/canola oil. Nonlimiting examples of suitable seed oils include cottonseed oil, sesame oil, bottle gourd oil, buffalo gourd oil, pumpkin seed oil, watermelon seed oil, grape seed oil, blackcurrant seed oil, borage seed oil, carob seed pods, coriander seed oil, flax seed/linseed oil, kapok seed oil, kenaf seed oil, meadowfoam seed oil, okra/hibiscus seed oil, papaya seed oil, perilla seed oil, pequi seed oil, poppy seed oil, ramtil seed oil, royle seed oil, tea seed/camellia oil, and tomato seed oil.

In an embodiment, the dielectric fluid includes from 70 wt % to 98 wt % farnesene-based oligomer, from 1 wt % to 2 wt % antioxidant, from 0 wt %, or greater than 0 wt % to 1 wt % additive, and from 20 wt %, or 22 wt % to 30 wt % blend component. The component proportions are combined to 100 wt % (total weight of the dielectric fluid).

The present dielectric fluid may comprise two or more embodiments disclosed herein.

4. Properties

The present dielectric fluid has one or more of the following properties.

"Dielectric strength" (in MV/m or kV/mm) is the maximum electric field strength that a dielectric fluid can withstand intrinsically without breaking down. The dielectric strength is measured by taking 100-150 ml oil sample in a test cell and applying a voltage between test electrodes separated by a specified gap. The breakdown voltage is noted in volts per millimeter. The test is preferably run five times and the average value is calculated. The dielectric strength of the present dielectric fluid is greater than 20 kV/mm (1 mm gap), or greater than 35 kV (2.5 mm gap) or greater than 40 KV/100 mil (2.5 mm) gap as measured in accordance with ASTM D 1816.

"Dissipation factor" is a measure of the electrical loss due to conducting species and is tested by measuring the capacitance of fluids in a test cell using a capacitance bridge. The dissipation factor for the present dielectric fluid is less than 0.5% at 25° C., or less than 0.2%, or less than 0.1% as measured in accordance with ASTM D 924.

"Acidity" is measured by titrating a known volume of oil with a solution of alcoholic KOH to the neutralization point. The weight of the oil in grams per mg KOH is referred to interchangeably as the acidity number or the neutralization number. The acidity (neutralization number) for the present dielectric fluid is less than 0.03 mg KOH/g, or less than 0.02 mg KOH/g as measured in accordance with ASTM D 974.

"Electrical conductivity" is measured using a conductivity meter such as an Emcee meter. The electrical conductivity for the present dielectric fluid is less than 1 pS/m at 25° C. or less than 0.25 pS/m as measured in accordance with ASTM D 2624.

"Flash point" is the temperature of the fluid that will result in an ignition of the fluid's vapors when exposed to air and an ignition source. The flash point for the present dielectric fluid is at least 145° C., or at least 200° C., or at least 250° C., or at least 300° C. as measured in accordance with ASTM D 92.

"Fire point" is the temperature of the fluid at which sustained combustion occurs when exposed to air and an ignition source. The fire point temperature for the present dielectric fluid is greater than 300° C., or greater than 325° C. as measured in accordance with ASTM D 92.

"Pour point" is the lowest temperature at which a liquid will pour or flow under prescribed conditions. The pour point for the present dielectric fluid is less than −20° C., or less than −25° C., or less than −30° C. as measured in accordance with ASTM D 97.

"Water saturation point" is the percentage of saturation of water in the dielectric fluid. The water saturation point is a function of the temperature and chemical structure of the dielectric fluid. As the water saturation point increases, the dielectric strength generally decreases. The water saturation point or the moisture level for the present dielectric fluid is reduced (if necessary via vacuum operation or the like) to less than or equal to 50 ppm. Water saturation point is determined in accordance with ASTM D 1533.

The present dielectric fluid has a water content less than 200 ppm, or from 0 ppm, or 10 ppm, to 100 ppm, or less than 200 ppm as measured in accordance with ASTM D 1533.

The present dielectric fluid is free, void, or otherwise devoid of PCB. In other words, the amount of PCB (if any) present in the dielectric fluid is not detectible by way of ASTM D 4059.

"Viscosity" is the measurement of the resistance of a fluid to flow. In an embodiment, the present dielectric fluid has a viscosity less than 50 cSt, or less than 40 cSt at 40° C. and less than 15 cSt at 100° C. as measured in accordance with ASTM D 445 (Brookfield viscometer).

The present dielectric fluid may have any combination of the foregoing properties.

5. Device

The present disclosure provides a device. In an embodiment, the device includes an electrical component and the present dielectric fluid is in operative communication with the electrical component. The present dielectric fluid includes the farnesene-based oligomer, an antioxidant, and optional additive(s) as previously discussed herein. Nonlimiting examples of suitable electrical components include a transformer, a capacitor, a switching gear, a transmission component, a distribution component, a switch, a regulator, a circuit breaker, an autorecloser, or like components, a fluid-filled transmission line, and/or combinations thereof.

The dielectric fluid is in operative communication with the electrical component. As used herein, "operative communication" is a configuration and/or a spatial relationship enabling the dielectric fluid to cool and/or insulate the electrical component. Operative communication thereby includes direct or indirect contact between the dielectric fluid and the electrical component by way of the following configurations: dielectric fluid, in, on, around, adjacent to, contacting, surrounding (wholly or partially) through, in proximity to the electrical component; and the electrical component immersed (wholly or partially) in the dielectric fluid.

In an embodiment, the farnesene-based oligomer in operative communication with the electrical component has a molecular weight from 600 g/mol to 2500 g/mol.

In an embodiment, the electrical component includes a cellulose-based insulation material. Nonlimiting examples of suitable cellulose-based insulation material include kraft paper and/or pressboard. The dielectric fluid is in contact with the cellulose-based insulation material.

In an embodiment, the electrical component is a transformer. The present dielectric fluid is in operative communication with the transformer. In the transformer, the present dielectric fluid provides (1) a liquid coolant that dissipates heat energy generated by the transformer operation and/or (2) an insulator between internal live parts that prevents electrical components from contacting or arcing over the transformer. The dielectric fluid is present in the transformer in an amount to perform functions (1) and/or (2).

In an embodiment, the transformer is a distribution transformer. A distribution transformer includes primary and secondary coils or windings in a housing or a tank and a dielectric fluid in the tank in operative communication with the windings. The windings are insulated from each other, via the dielectric fluid, and are wound around a common core of magnetically suitable material, such as iron or steel. The core and/or the windings may also have laminations, insulative coatings or insulation paper materials to further insulate and absorb heat. The core and windings are immersed in the dielectric fluid, allowing free circulation of the fluid. The dielectric fluid covers and surrounds the core and windings. The dielectric fluid completely fills all small voids in the insulation and elsewhere within the housing. The transformer housing provides an air-tight and fluid-tight seal around the tank preventing ingress of air and/or contaminants which may collect and eventually cause failure of the transformer. A distribution transformer has a system voltage typically in the range of 36 kV or less.

In an embodiment, the electrical component is a power transformer. A power transformer has a system voltage typically in the range of 36 kV or greater.

In order to improve the rate of heat transfer from the core and coil assembly, the transformer may include additional structures for providing increased cooling, such as fins on the tank that are provided to increase the surface area available to provide cooling. Radiators or tubes may be attached to the tank so that hot dielectric fluid that rises to the top of the tank may cool as it circulates through the tubes and returns at the bottom of the tank. These tubes, fins or radiators provide additional cooling surfaces beyond those provided by the tank walls alone. Fans may also be provided to force a current of air to blow across the heated transformer enclosure, or across radiators or tubes to better transfer the heat from the hot dielectric fluid and heated tank to the surrounding air. Also, some transformers include a forced oil cooling system which includes a pump to circulate the dielectric fluid from the bottom of the tank through pipes or radiators to the top of the tank (or from the tank to a separate and remote cooling device and then back to the transformer).

In an embodiment, the present dielectric fluid is biodegradable and is non-toxic. Biodegradability eases disposal of the present dielectric fluid and eliminates hazards in the event the dielectric fluid is spilled onto the earth or surfaces in the vicinity of the transformer's location.

In an embodiment, the present disclosure provides a process that includes placing the present dielectric fluid in operative communication with an electrical component. The process further includes cooling the electric component with the present dielectric fluid. The electrical component may include any one of a transformer, a capacitor, a switching gear, a power cable, a distribution component (such as an oil-filled distribution cable), a switch, a regulator, a circuit breaker, an autorecloser, fluid-filled transmission line, and/or combinations thereof.

In an embodiment, the present disclosure provides a process that includes placing the present dielectric fluid in operative communication with an electrical component. The process further includes insulating the electric component with the dielectric fluid. The electrical component may include any one of a transformer, a capacitor, a switching gear, a power cable, a distribution component (such as an oil-filled distribution cable), a switch, a regulator, a circuit breaker, an autorecloser, fluid-filled transmission line, and/or combinations thereof.

DEFINITIONS

"Antioxidant" is a molecule capable of slowing or preventing the oxidation of other molecules.

The terms "comprising", "including", "having" and their derivatives do not exclude the presence of any additional component or procedure. The term, "consisting essentially of" excludes any other component or procedure, except those essential to operability. The term "consisting of" excludes any component or procedure not specifically stated.

"Dielectric fluid" is a non-conducting fluid having a dielectric breakdown greater than 20 kV as measured in accordance with ASTM D 1816 (VDE electrodes, 1 mm gap) and/or a dissipation factor of less than 0.2% as measured in accordance with ASTM D 924 (60 Hz, 25° C.), and less than 4 at 100° C. (ASTM D 924, 60 Hz). A dielectric fluid provides coolant and/or insulative properties when placed in operative communication with an electrical component.

"Oxidation" is a chemical reaction that transfers electrons from a substance to an oxidizing agent. Oxidation reactions can produce reactive free radicals, which can degrade a composition. Antioxidants can terminate free radicals.

Some embodiments of the present disclosure will now be described in detail in the following Examples.

Examples

1. Oligomerization of Farnesene

Procedure 1. A pressure reactor of a capacity of 100 ml is filled with nitrogen and 2 mmoles of nickelnaphthenate, 20 ml of GMF and 2 mmoles of phenylacetylene are added and dissolved. Then 12 mmoles of triethylaluminum are added drop-wise at −10 to −20° C. for reduction, and further, the entire mixture is reacted at room temperature. The remaining mole balance of GMF is added to the resulting reaction mixture and then the container is tightly sealed to carry out the reaction for 12 hours at 80° C. After the reaction is completed, the catalyst is extracted with ethyl ether. The ether layer is washed with aqueous sodium bicarbonate solution and followed by washing with water. The resulting farnesene trimer is obtained by phase separation steps including distillation. The farnesene trimer has a molecular weight of 612 g/mol (calculated).

The farnesene trimer can then be hydrogenated with palladium catalyst on barium sulfate support to produce farnesane trimer.

2. Dielectric Fluid with Farnesene Oligomer

TABLE 1

| Components | |
|---|---|
| Components | Source |
| Farnesene trimer | Procedure 1 |
| Antioxidant 1 | VANOX ® MBPC 2,2'-methylene-bis(4-methyl-6-tert-butylphenol), available from R. T. Vanderbilt Company, Inc |
| Antioxidant 2 | Naugalube ® 438L nonylated diphenylamine, available from Chemtura Corporation |
| Pour Point Depressant (PPD) | VISCOPLEX ™ 10-310 is an alkyl methacrylate with a molecular weight of about 200,000, available from Rohmax, Inc. |

The components from Table 1, 97.5 wt % of the farnesene trimer, 0.5 wt % antioxidant 1, 1.0 wt % antioxidant 2, and 1.0 wt % PPD are mixed in a flask at 70-80° C. for 1 hour. Weight percent is based on total weight of the mixture. The product, Dielectric Fluid A, has the properties shown in Table 2 below.

TABLE 2

Properties for Dielectric Fluid A

| Properties | Test Method | Value |
|---|---|---|
| Fire Point, ° C. | ASTM D92 | >300 |
| Viscosity @ 40° C., cSt | ASTM D445 | <50 |
| Viscosity @ 100° C., cSt | ASTM D445 | <15 |
| Pour Point, ° C. | ASTM D97 | <−20 |
| Neutralization Number, mg KOH/g | ASTM D974 | <0.03 |
| Dielectric Strength, 1 mm gap, kV | ASTM D1816 | >20 |
| Power Factor at 25° C., % | ASTM D924 | <0.2 |
| Power Factor at 100° C., % | ASTM D924 | <4.0 |

What is claimed is:

1. A dielectric fluid comprising:
   a farnesene-based oligomer having a molecular weight from 600 g/mol to 2500 g/mol; and
   an antioxidant.

2. The dielectric fluid of claim 1 wherein the farnesene-based oligomer comprises a genetically-modified farnesene.

3. The dielectric fluid of claim 1 comprising from 0.1 wt % to 2.0 wt % antioxidant.

4. The dielectric fluid of claim 1 wherein the farnesene-based oligomer comprises a farnesene trimer.

5. The dielectric fluid of claim 1 wherein the farnesene-based oligomer is a farnesene/terpenoid oligomer with the structure (IV)

$$-[F]_m-[T]_n- \quad (IV)$$

wherein F represents units derived from farnesene;
T represents units derived from terpenoid; and
each of m and n is an integer from 1 to 9.

6. The dielectric fluid of claim 5 wherein the farnesene/terpenoid oligomer comprises from 70 wt % to 99 wt % units derived from farnesene and from 30 wt % to 1 wt % units derived from terpenoid.

7. The dielectric fluid of claim 5 wherein the terpenoid is selected from the group consisting of zingiberene, bisabolene, farnesene epoxide, farnesol, squalene, ergosol, and combinations thereof.

8. The dielectric fluid of claim 1 comprising a blend component selected from the group consisting of a microbial oil, a vegetable oil, a seed oil, a mineral oil, silicon fluid, a synthetic ester, a poly-alpha-olefin, and combinations thereof.

9. A device comprising:
   an electrical component; and
   a dielectric fluid in operative communication with the electrical component, the dielectric fluid comprising
      a farnesene-based oligomer having a molecular weight from 600 g/mol to 2500 g/mol; and
      an antioxidant.

10. The device of claim 9 wherein the electrical component comprises a cellulose-based insulation material in contact with the dielectric fluid.

11. The device of claim 9 wherein the electrical component is selected from the group consisting of a transformer, a capacitor, a switch, a regulator, a circuit breaker, a recloser, a fluid-filled transmission line, and combinations thereof.

12. The dielectric fluid of claim 5 wherein and 3≤m+n≤10.

13. The dielectric fluid of claim 1 having
   (i) a viscosity less than 50 cSt at 40° C.;
   (ii) a fire point temperature greater than 300° C.; and
   (iii) a pour point less than −20° C.

14. The dielectric fluid of claim 1 having a dissipation factor less than 0.5% at 25° C., as measured in accordance with ASTM D 924.

15. The dielectric fluid of claim 1 have an acidity less than 0.03 mg KOH/g as measured in accordance with ASTM D 974.

16. The dielectric fluid of claim 1 having an electrical conductivity less than 1 pS/m at 25° C. as measured in accordance with ASTM D 2624.

17. The dielectric fluid of claim 1 having a flash point of at least 145° C. as measured in accordance with ASTM D 92.

18. The dielectric fluid of claim 1 having a fire point temperature greater than 300° C. as measured in accordance with ASTM D 92.

19. The dielectric fluid of claim 1 having a pour point temperature less than −20° C. as measured in accordance with ASTM D 97.

20. The dielectric fluid of claim 1 having a water saturation point of less than or equal to 50 ppm as measured in accordance with ASTM D 1533.

* * * * *